United States Patent
Steinbauer et al.

(10) Patent No.: US 11,047,633 B2
(45) Date of Patent: Jun. 29, 2021

(54) METHOD FOR DETERMINING A STATE OF A HEAT EXCHANGER DEVICE

(71) Applicant: LINDE AKTIENGESELLSCHAFT, München (DE)

(72) Inventors: Manfred Steinbauer, Raisting (DE); Thomas Hecht, Puchheim (DE); Christiane Kerber, Pocking (DE); Reinhold Holzl, Geretsried (DE); Axel Lehmacher, Egling-Moosham (DE); Pascal Freko, Eurasburg (DE); Ingo Thomas, Oberhaching (DE); Alexander Woitalka, Munich (DE)

(73) Assignee: LINDE AKTIENGESELLSCHAFT, Munich (DE)

( * ) Notice: Subject to any disclaimer, the term of this patent is extended or adjusted under 35 U.S.C. 154(b) by 552 days.

(21) Appl. No.: 15/576,710

(22) PCT Filed: May 25, 2016

(86) PCT No.: PCT/EP2016/000869
§ 371 (c)(1),
(2) Date: Nov. 27, 2017

(87) PCT Pub. No.: WO2016/188635
PCT Pub. Date: Dec. 1, 2016

(65) Prior Publication Data
US 2018/0259272 A1    Sep. 13, 2018

(30) Foreign Application Priority Data

May 28, 2015  (EP) ..................................... 15169745
Dec. 10, 2015  (EP) ..................................... 15003521

(51) Int. Cl.
*F28F 27/00*  (2006.01)
*G06F 30/28*  (2020.01)
*G06F 30/23*  (2020.01)

(52) U.S. Cl.
CPC .......... *F28F 27/00* (2013.01); *F28F 2200/00* (2013.01); *G06F 30/23* (2020.01); *G06F 30/28* (2020.01)

(58) Field of Classification Search
CPC ....... F28F 27/00; F28F 2200/00; G06F 30/20; G06F 30/28; G06F 30/23
See application file for complete search history.

(56) References Cited

U.S. PATENT DOCUMENTS

| 7,788,073 B2 * | 8/2010 | Holzl | .................... F28D 9/0068 703/9 |
| 9,330,227 B1 * | 5/2016 | Han | ........................ G06F 30/20 |

(Continued)

FOREIGN PATENT DOCUMENTS

| DE | 10360240 A1 | 3/2005 |
| DE | 102004048660 A1 | 6/2006 |

(Continued)

OTHER PUBLICATIONS

Comini, G. & Savino, S. "Accuracy of One-Dimensional Design Procedures for Finned-Tube Heat Exchangers" Applied Thermal Engineering, vol. 29, pp. 2863-2869 (2009) (Year: 2009).*

(Continued)

*Primary Examiner* — Jay Hann
(74) *Attorney, Agent, or Firm* — Millen White Zelano & Branigan, PC; Brion P. Heaney

(57) ABSTRACT

The invention relates to a method for determining the state of a heat exchanger device (10) that comprises means for transferring heat with the aid of at least one process stream. A thermohydraulic simulation of the at least one process (Continued)

stream through at least one passage (14) in the heat exchanger device (10) is carried out in order to determine temperature and/or heat transfer coefficient profiles of the means for transferring heat.

13 Claims, 7 Drawing Sheets

(56) References Cited

U.S. PATENT DOCUMENTS 10,303,815 B2 * 5/2019 Aylott ................. G06Q 50/06
2003/0062149 A1 4/2003 Goodson et al.

FOREIGN PATENT DOCUMENTS

| DE | 102010040029 A1 | 3/2012 |
|---|---|---|
| EP | 1 830 149 B1 | 3/2009 |

OTHER PUBLICATIONS

Holzl, R. "Lifetime Estimation of Aluminum Plate Fin Heat Exchangers" Proceedings of ASME 2012 Pressure Vessels & Piping Conf. (2012) (Year: 2012).*

Holzl, R., et al. "Damage Analysis and Fatigue Evaluation of an Aluminium Brazed Plate Fin Heat Exchanger" Proceedings of ASME 2014 Pressure Vessels & Piping Conf. (2014) (Year: 2014).*

Chorak, A., et al. "Numerical Evaluation of Heat Transfer in Corrugated Heat Exchangers" IEEE (2014) (Year: 2014).*

Lin, D., et al. "The Optimal Design Process of the Plate Heat Exchanger" IEEE 2010 Int'l Symposium on Computer Communication Control & Automation, pp. 237-240 (2010) (Year: 2010).*

Carter, P., et al. "Failure Analysis and Life Prediction of a Large, Complex Plate Fin Heat Exchanger" Engineering Failure Analysis, vol. 3, pp. 29-43 (1996) (Year: 1996).*

Syed, F. & Idem, S. "Transient Performance of a Cross Flow Heat Exchanger Using Finite Difference Analysis" Proceedings of IMECE2008 ASME Int'l Mechanical Engineering Congress & Exposition (2008) (Year: 2008).*

Luyben, W. "Heat Exchanger Simulations Involving Phase Changes" Computers & Chemical Engineering, vol. 67, pp. 133-136 (2014) (Year: 2014).*

Tsai, Y., et al. "Investigations of the Pressure Drop and Flow Distribution in a Chevron-Type Plate Heat Exchanger" Int'l Communication in Heat & Mass Transfer, vol. 36, pp. 574-578 (2009) (Year: 2009).*

International Search Report for PCT/EP2016/000869, dated Sep. 28, 2016, Authorized Officer: Frank Mootz, 11 pages.

* cited by examiner

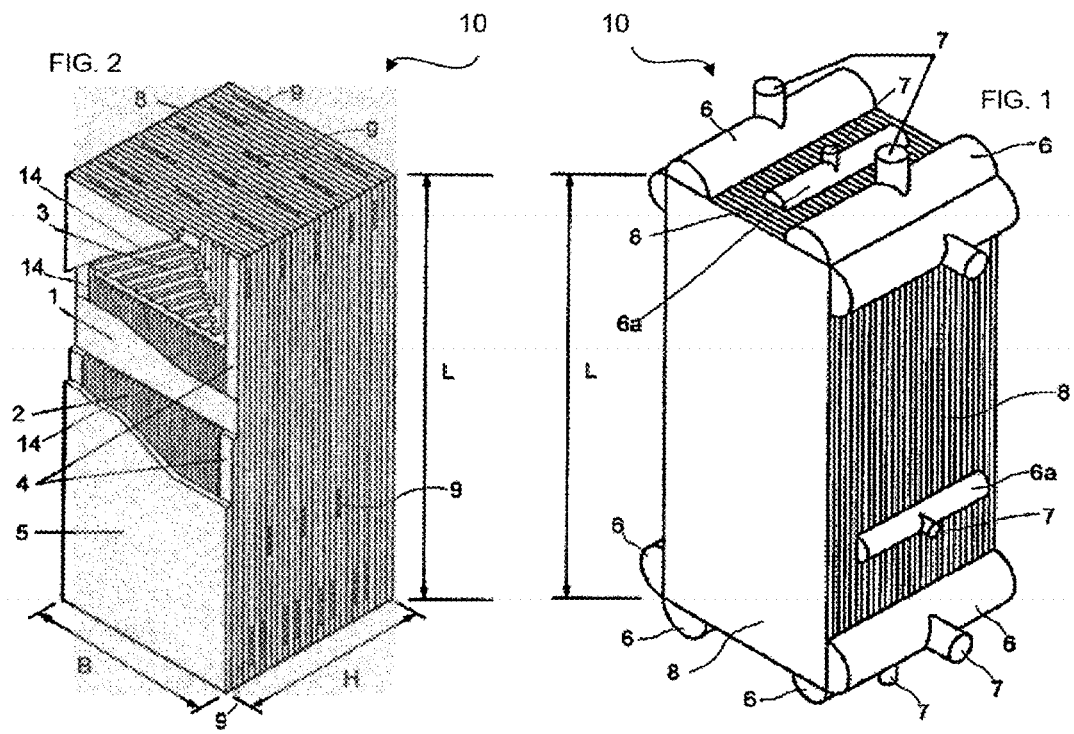
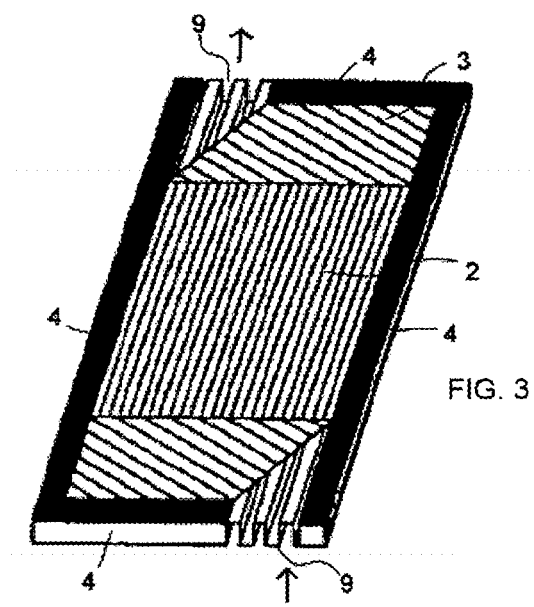

METHOD FOR DETERMINING A STATE OF A HEAT EXCHANGER DEVICE

The invention relates to a method for determining a state, such as for example a strength, of a heat exchanger device. This involves considering plate heat exchangers for example, and methods for producing a heat exchanger and/or an industrial plant are also proposed. The invention also relates to a method for operating heat exchangers or heat transferers or industrial plants.

It is desirable to predict the mechanical and thermal stress of elements in industrial plants, such as for example air separation or gas liquefaction plants, in order to estimate their lifetime, susceptibility to maintenance or stability. This requires methods of simulation that realistically replicate the operation of the plant and provide state variables of the elements fitted in the plant. These methods of simulation usually require an extremely great computational effort or do not provide sufficiently precise data.

The object of the present invention is therefore to provide improved possibilities for simulation.

This object is achieved by a method for determining a state of a heat exchanger device, which has means for transferring heat with the aid of at least one process stream, wherein the method comprises a thermohydraulic simulation of the at least one process stream through at least one passage in the heat exchanger device being performed for determining temperature and/or heat transfer coefficient profiles of the means for transferring heat.

Accordingly, a method for determining a state of a heat exchanger device that has means for transferring heat with the aid of process streams is proposed. This involves performing a thermohydraulic simulation of one or more process streams through one or more passages in the heat exchanger device for determining temperature and/or heat transfer coefficient profiles of the means for transferring heat.

The process stream or streams may be material streams and in particular fluid streams of a respective process fluid or be formed by energy streams.

To this extent, in one embodiment a method for determining a state of a heat exchanger device that has means for transferring heat with the aid of fluid streams of a process fluid is proposed, a method in which a thermohydraulic simulation of the fluid streams of the process fluid through passages in the heat exchanger device is performed for determining temperature and/or heat transfer coefficient profiles of the means for transferring heat.

The process fluid is, in particular, a fluidic medium of a cryogenic plant, such as liquids, liquefied gases or gas mixtures. Water, liquid gas, liquefied air or air separation products are conceivable for example.

The state of the heat exchanger device that is to be determined is, in particular, a thermohydraulic state. The determination of a state of strength is also conceivable.

The term "means", used in the plural, should be understood as a generic term, and so it is not absolutely necessary for there to be a number of structural elements for transferring heat.

A heat exchanger device is conventionally considered to be a device that is suitable for transferring heat from a first side to a second side. It is also possible to refer to a heat transfer device that has structural means. Strictly speaking, no "exchange" of heat takes place here, but rather a quantity of heat is transferred, for which reason reference is also made hereinafter to a heat transferer.

In principle, the term "heat exchanger" as it is intended in this description also comprises devices that transfer or conduct quantities of heat. To this extent, a so-called heat pipe may also be understood as being a heat exchanger device. A heat-conducting element in a plant, that is to say a means for transferring heat, may also be understood as a heat exchanger device.

Furthermore, a so-called regenerator, in which initially heat—for example extracted from a first fluid—is stored and subsequently the heat is given off—for example to a second fluid, is considered to be a heat exchanger device.

In embodiments, the heat exchanger device is designed to transfer a quantity of heat from a first fluid to a second fluid. Another term used is a recuperator.

The proposed method relates here to devices in general that can transfer heat.

It involves a thermohydraulic determination of temperature profiles in passages of the heat exchanger that can vary over time. These dynamic temperature profiles are required as boundary conditions of the structural-mechanical calculation. This is carried out for example with the aid of finite element methods (FEM). The temperature profiles determined may be found on structural elements of the heat exchanger that conduct the process fluid. It is also possible however to refer to temperature or heat transfer coefficient profiles of the respective process fluid streams.

Temperature boundary conditions and/or heat transfer coefficient profiles that change over time, in particular at the means for transferring heat, are preferably determined In the thermohydraulic simulation. In developments of the method, concentration and/or vapor fraction profiles of the process fluid are also determined. By determining the aforementioned profiles with the aid of thermohydraulic simulation, with the profiles serving as boundary conditions for further methods of determination for the heat exchanger or heat transferer, reliable determination of a state is made possible with reduced computational effort. Within the simulation, thermodynamic states and fluid-dynamic states in the heat exchanger device or an industrial plant are therefore determined simultaneously.

The temperature boundary conditions that change over time are determined in embodiments with the aid of a model for a phase transition of the process fluid, for a material separation of constituents of the process fluid or a demixing of constituents of the process fluid, for a filling operation with the process fluid and/or for fluid-dynamic instabilities of the process fluid.

In embodiments, a respective passage with a coupled means for transferring heat to a one-dimensional model system with a process stream feed, a heat transfer section and a process stream discharge is replicated for the thermohydraulic simulation, a body with a heat capacity, in particular a one-dimensionally extended body, lying along the heat transfer section.

In the thermohydraulic simulation, a heat capacity value and/or a heat transfer value for the one-dimensional extended body are preferably increased incrementally or continuously in order to ensure a numerical convergence of the one-dimensional model system.

In embodiments, the method comprises at least one or more, preferably all, of the following steps:
 recording a number of passages, preferably all the passages, of a heat exchanger and/or an industrial plant with in each case a starting point and an end point, a respective starting or end point corresponding to a process stream feed or a process stream discharge;

recording nodes between the passages recorded, a number of starting and/or end points converging at a node;

assigning a one-dimensional model to each passage recorded;

establishing pressures of the process fluid at process stream discharges and the nodes; and carrying out a spatially and temporally discretized computer-implemented calculation of the one-dimensional model or models for determining the temperature and/or heat transfer coefficient profiles.

Preferably, a complete spatially resolved thermodynamic state in one dimension is incorporated in a simulation along the lines of a Navier-Stokes description. That is to say that mass, momentum and energy balances are considered one-dimensionally. To this extent, it can be said that a respective passage is described with the aid of one-dimensional Navier-Stokes equations for the thermohydraulic simulation.

Preferably, adiabatic boundary conditions are used at the starting and end points of a passage that is for example bounded by metal elements or at a process stream feed and a process stream discharge on the metal. That is to say that it is assumed that no heat transfer in the direction of flow of the process fluid takes place within the metal.

In variants of the method, the corresponding one-dimensional simulation includes terms that describe: a temporal mass enrichment of the process fluid, a spatial mass transfer of the process fluid, a rate of reaction, a temporal momentum enrichment of the process fluid, a spatial momentum transfer of the process fluid, a spatial pressure gradient, a spatial friction, influences of gravitational force on the process fluid, a temporal energy enrichment of the process fluid, a spatial enthalpy transfer of the process fluid, a work of expansion of the process fluid, friction dissipation and/or a heat input or acoustic input from outside.

Embodiments of the methods serve for predicting the lifetime of parts of an industrial plant, such as for example a heat exchanger, under the influence of thermal changes during the operation of the plant. Another term used is a lifetime consumption analysis. According to a variant of the method, the state of the heat exchanger device is determined as a lifetime consumption in the manner of a Wöhler curve, stress being determined in dependence on a number of operating cycles of the heat exchanger device.

The means for transferring heat may comprise a tube, a plate, a parting sheet, a profiled part, a fin or a rib.

Preferably, the simulation takes into account a Joule-Thompson effect of the process stream in the passages.

A temporal and spatial discretization is performed in particular when carrying out the method.

The state of the heat exchanger device is optionally determined with the aid of a finite element method (FEM) for a structural-mechanical calculation of the state in dependence on the variable temperature boundary conditions. This may involve determining states of stress (spatially and temporally distributed) of the heat transfer device.

A method for producing a plant or heat exchanger device is also proposed, structural parameters of the heat exchanger device being established in dependence on a specific state as a result of the method for determining a state of the heat exchanger device of the type to be produced. In this case, at least one structural parameter is in particular a brazing location, a material thickness or a choice of material.

By a prior simulation, for example specific operating situations for the heat exchanger, and a corresponding determination of a state as a lifetime consumption analysis, the design of the plant or of the heat exchanger can be adapted in such a way that there is an improved life expectancy. For example, fins, length or width specifications, layer patterns, two-phase feeds or further structural measures may be taken. Production should also be understood as including modification of existing plants, with for example fitted heat exchangers, in order to achieve improved simulated or predicted lifetimes. It is also possible to this extent to refer to a method for converting a plant or heat exchanger device if a modification of the plant is performed on the basis of simulations carried out.

A method for operating a plant or heat exchanger device is also proposed, operating parameters being established in dependence on a specific state as a result of the aforementioned method for determining a state of the heat exchanger device, and an operating parameter being in particular a pressure, a maintenance interval or a time for the exchange of means for transferring heat.

By a simulation, for example of specific operating situations or operating procedures for the heat exchanger or the plant, and a corresponding determination of a state as a lifetime consumption analysis, the design or the operation of the plant or the heat exchanger can be adapted in such a way that there is an improved life expectancy. The simulation performed consequently makes it possible for plants that comprise heat exchangers to be operated in an optimized way.

Furthermore, a computer program product which initiates the execution of the method or methods as described above on a program-controlled device is proposed. The execution is conceivable, for example, with the aid of a computer or a control-room computer for an industrial plant. The determination of the (thermohydraulic) state of the respective heat transferer may be implemented in the manner of a process simulator. This allows interactions, in particular modular interactions, of the heat exchanger considered with further parts of the plant to be taken into account. The process simulator may be part of a simulation software.

A computer program product, such as for example a computer program means, can be provided or supplied, for example, as a storage medium, such as for example a memory card, USB stick, CD-ROM, DVD, or even in the form of a downloadable file from a server in a network. This can take place, for example, in a wireless communication network by the transfer of a corresponding file with the computer program product or the computer program means.

The method or the methods are in particular software-implemented, and reference will also be made below synonymously to a simulation software and/or a process simulator.

In addition, a user interface for such a process simulator is proposed. The user interface then comprises a display device, which is designed to present visually a network of passages, first selection means for selecting a passage presented, second selection means for allocating a one-dimensional model to a selected passage, and third selection means for allocating simulation parameters to the one-dimensional model allocated to the selected passage, the user interface being communicatively coupled to the process simulator.

Preferably, the display device of the user interface is also designed to display a number of variants of one-dimensional models for selection, the variants allowing account to be taken of a temporal mass enrichment of the process fluid, a spatial mass transfer of the process fluid, a rate of reaction, a temporal momentum enrichment of the process fluid, a spatial momentum transfer of the process fluid, a spatial pressure gradient, a spatial friction, influences of gravitational force on the process fluid, a temporal energy enrichment of the process fluid, a spatial enthalpy transfer of the process fluid, a work of expansion of the process fluid, friction dissipation and/or a heat input or acoustic input from outside for the respective passage.

A simulation device then comprises at least one process simulator and a user interface, as described above and below, and the user interface transfers the selected and allocated specifications for the selected passages, the respective allocated variants of one-dimensional models and the allocated simulation parameters to the process simulator.

Further possible implementations of the invention also comprise combinations of features or embodiments described above or below with regard to the exemplary embodiments that have not been specified explicitly. The person skilled in the art will also add individual aspects as improvements or supplementations to the respective basic form of the invention.

Further advantageous configurations and aspects of the invention form the subject matter of the dependent claims and of the exemplary embodiments of the invention described below. The invention is explained in detail hereinafter on the basis of preferred embodiments with reference to the appended figures.

FIG. 1 shows schematically and perspectively a plate heat exchanger from outside with a number of added components.

FIG. 2 shows the plate heat exchanger from FIG. 1 with a partly removed cover sheet, without the added components.

FIG. 3 shows schematically and perspectively a passage from the plate heat exchanger of FIGS. 1 and 2.

Figure 4:
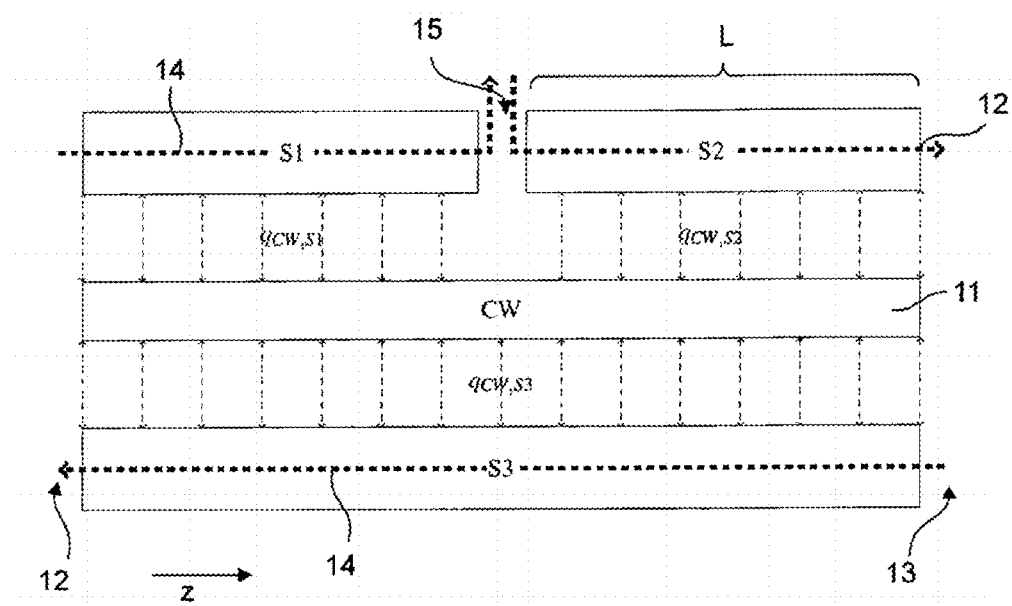
FIG. 4 shows a representation of a passage model.

In the figures, elements that are identical or have the same function have been given the same reference signs, unless stated otherwise.

FIG. 1 shows as an example of a heat transfer device a plate heat exchanger 10 from the outside. The plate heat exchanger 10 has a central cuboid 8 with a length L of approximately 6 m and a width or height B, H of in each case 1.2 m. On top of the cuboid 8, at its sides and under the cuboid 8, attachments 6 and 6a can be seen. There are also such attachments 6 and 6a under the cuboid 8 and on the side facing away from the side that is depicted. These are partially concealed however. A process fluid, for example water, can be supplied to the plate heat exchanger 10 and removed again from it through nozzles 7. When it flows through, a process stream is therefore obtained. The attachments 6 and 6a serve for distributing the water introduced through the nozzles 7 and for collecting and concentrating the water removed from the plate heat exchanger 10. Within the plate heat exchanger 10, the various streams of water then exchange heat.

The plate heat exchanger 10 shown in FIG. 1 is designed to make more than two process streams pass by one another in separate passages for heat exchange. Some of the streams can be made to pass by one another counter-currently, others cross-currently. For further explanation, the simplified situation that two process streams flow past one another in separate alternating passages is considered. In principle, greater numbers of process streams can also be handled and incorporated in a simulation.

In FIG. 2 it can be seen how the plate heat exchanger 10 is constructed internally. This is substantially a cuboid 8 comprising parting sheets 1 and internals for improving heat transfer 2, so-called fins 2, and distributing profiles 3. Layers comprising parting sheets 1 and profiles 2 or 3 alternate. A layer comprising a heat exchanging profile 2 and distributing profiles 3 is referred to as a passage 14 (such a passage is shown in FIG. 3 and is described below).

The cuboid 8 therefore has alternately passages 14 and parting sheets 1 lying parallel to the directions of flow. Both the parting sheets 1 and the passages 14 are produced from aluminum. To their sides, the passages 14 are closed off by bars 4 of aluminum, and so a side wall is formed by the stacked construction with the parting sheets 1. The passages 14 lying on the outside of the cuboid 8 are covered by a covering 5 of aluminum lying parallel to the passages and the parting sheets 1.

The cuboid 8 is produced by applying a brazing solder to the surfaces of the parting sheets 1 and subsequently stacking the parting sheets 1 and the passages 14 alternately one on top of the other. The coverings 5 cover the stack 8 at the top or bottom. Subsequently, the stack 8 was brazed by heating in a furnace enclosing the stack 8. When dimensioning the brazing locations or the material thicknesses, methods that predict or calculate the states of strength of the elements of the heat transferer 10 may be used in particular. It is then possible for example for weaknesses or elements that are particularly subjected to stress to be reinforced during production. To be able in particular to determine stress distributions at the passages 14, it is desirable to simulate the dynamic temperature distributions and/or profiles of the local heat transfer coefficient profiles occurring as a result of the process streams.

On the sides of the plate heat exchanger 10, the distributing profiles 3 have distributing profile accesses 9. Through these, the water as a process fluid can be introduced into the associated passages 14 from the outside and also removed again via the attachments 6 and 6a and nozzles 7. The distributing profile accesses 9 shown in FIG. 2 are concealed in FIG. 1 by the attachments 6 and 6a.

FIG. 3 shows one of the passages 14 of the plate heat exchanger shown in FIGS. 1 and 2. The direction of flow of the water is indicated by arrows. The water flows in at the one distributing profile access 9, to be distributed in the associated distributing profile 3 over the entire width of the passage 14. Subsequently, the water flows through the heat exchanging profile 2 and, after heat exchange has taken place, is concentrated from the other distributing profile 3 to the distributing profile access 9 on the output side. On its long and short sides, the passage 14 is confined by the bars 4.

To promote swirls of the water, and thereby be conducive to the heat transfer, the heat exchanging profiles 2 are formed in the example as cut profiles (serrated fins).

Depending on the temperatures generated by the process streams flowing through the plate heat exchanger 10 during operation, the parting sheets 1 and the profiles 2 and 3 undergo changes of thermal expansion. This can lead to thermal stresses, which may fatigue and ultimately damage the plate heat exchanger 10.

By a thermohydraulic simulation of the temperature distribution in the plate heat exchanger 10 on the basis of these heat flows, the stress distribution is determined, in particular with the aid of a structural-mechanical calculation. On the basis of these simulated stress distributions, failure risks can be estimated, improved plate heat exchangers 10 can be designed and also, in particular, modes of operation can be optimized.

To determine the stress distribution in a plate heat exchanger, first the spatial and temporal temperature distribution is determined on the basis of a thermohydraulic simulation and from this the stress distribution is calculated.

To determine the temperature boundary conditions that change over time, in particular at the means for transferring heat, substantially a determination of the respective temperature and/or heat transfer coefficient profiles is performed. In embodiments, one-dimensional Navier-Stokes equations can be assumed for the passages as simplifying assumptions.

Account is preferably also taken of: an accumulation of energy in the process fluid, dissipation, correlations according to HTRI (Heat Transfer Research, Inc.), HTFS (Heat Transfer & Fluid Flow Service), VDI (Verein Deutscher Ingenieure; Society of German Engineers), etc. or correlations that can be defined by the user of the corresponding simulation software, for example: $\alpha=\alpha(x(z))$, $\alpha=\alpha(\dot{m}(z))$ where x is the mass fraction of vapor, z is the position in the passage and $\dot{m}$ is the mass flow. Furthermore, according to requirements, account can be taken for the momentum dynamics.

With respect to the energy balance, in a simplified variant of the method of simulation it is assumed for the 1-D heat capacity that:

$$\rho c_p \frac{\partial T}{\partial t} + v\rho c_p \frac{\partial T}{\partial z} = \dot{q}. \qquad (1)$$

where $c_p$ is the specific heat capacity, $\rho$ is the process fluid density, T is the temperature, v is the velocity of the process fluid, z is the one-dimensional position, and $\dot{q}$ is a heat input as a heat flow linear density. The equation (1) corresponds to a heated pipe or a passage for example of the length L.

FIG. 4 shows an example of three passages S1, S2, S3 and a dividing wall 11 with a heat capacity CW. A respective passage, for example S3, has a fluid inlet 13 and a fluid outlet 12. Between the passages S1, S2, S3 and the heat capacity CW (or the heat capacities), the heat transfer is described as a one-dimensional extended heat flow density profile. To simulate a branching, for example in the manner of a feed or discharge 15, the two passages S1 and S2 flow out and in at the location 15. A one-dimensional modeling is used for all the passages. In this case, the starting temperature distribution can be established as any desired. The length L along the one-dimensional axis z is indicated for the example of the passage S2. With respect to equation (1), the heat input for the passage S2 should be denoted as $\dot{q}$CW,S2.

Adiabatic boundary conditions may be used for the heat conduction of the one-dimensionally assumed dividing wall (for example of metal), that is to say:

$$\left.\frac{\partial T}{\partial z}\right|_{z=0, z=L} = 0.$$

To this extent, changes in temperature in the dividing wall 11 along the directions of flow of the fluids in the passages S1, S2, S3 are ignored. In variants of the proposed method, other boundary conditions may also be used or a heat transfer in dividing walls may also be included in the simulation.

Figure 5:
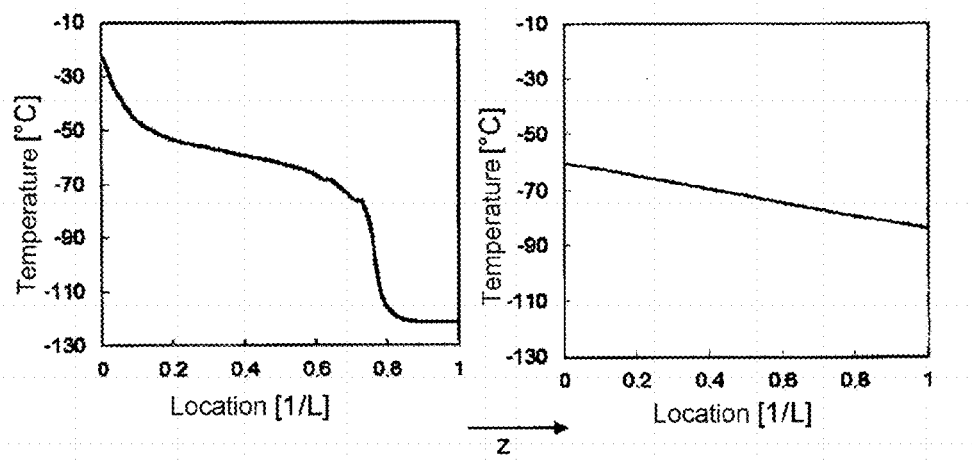
FIG. 5 shows diagrams with possible starting temperature distributions in a passage.

FIG. 5 shows two examples of an initial temperature distribution in dependence on the position z. Shown on the left is a starting temperature distribution, which originates from an energy balance assumed to be of a steady state and shown on the right is a distribution assumed to be any desired. The initial distribution may be used for example for one of the passages.

In the following FIGS. 6-10, simulation results are indicated. For this purpose, the differential equations of the hyperbolic conservation equation (1) to be solved were transformed into an integral equation of the following form:

$$a\frac{\partial \overline{T}}{\partial t} + b[F(z^+) - F(z^-)] = \overline{\dot{q}(T)}, \qquad (2)$$

where F is a function according to the second term from equation (1), a, b are corresponding prefactors and the prime symbol stands for the integral mean (integral mean value) according to $$\overline{f} = f(x^*) = \frac{1}{|\omega|}\int_\omega f(x)dx.$$

The locations $z^+$ and $z^-$ indicate the limits of the control volume $\omega$. There is therefore a discretization in the spatial domain of the z direction of the passage length L. Successive points $z_i$ and $z_{i+1}$ of the discretization form the respective control domain $z^+$ and $z^-$. In the spatial discretization, the satisfying of a Courant-Friedrichs-Levy condition is required for the expression indicated in square parentheses in equation (2). Thus, a quadratic equation system for differential equations in time is obtained.

The temporal discretization is performed for example with the aid of a BDF method (Backward Differentiation Formulae), which is not discussed in any more detail here. BDF methods for solving differential equations are known.

Figure 6:
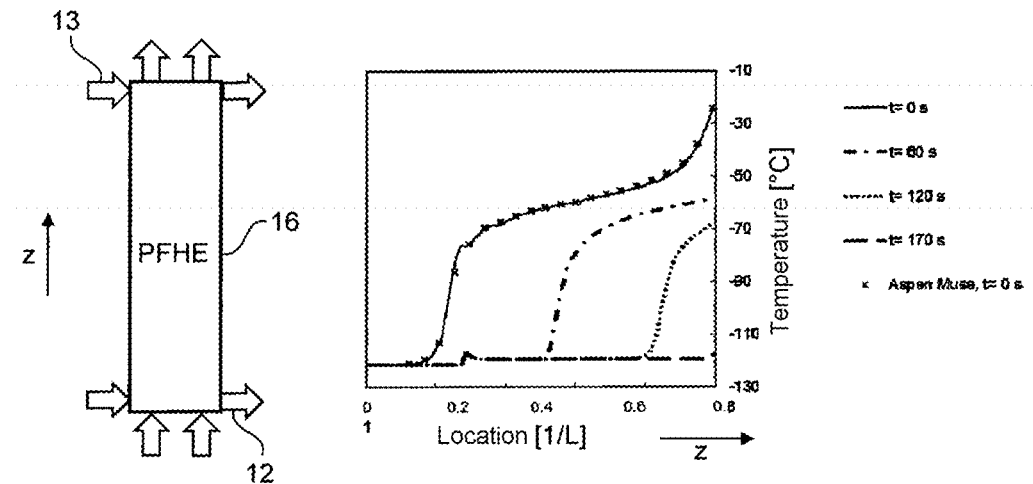
FIGS. 6-10 show simulation results for various embodiments of heat transferers.
Figure 7:
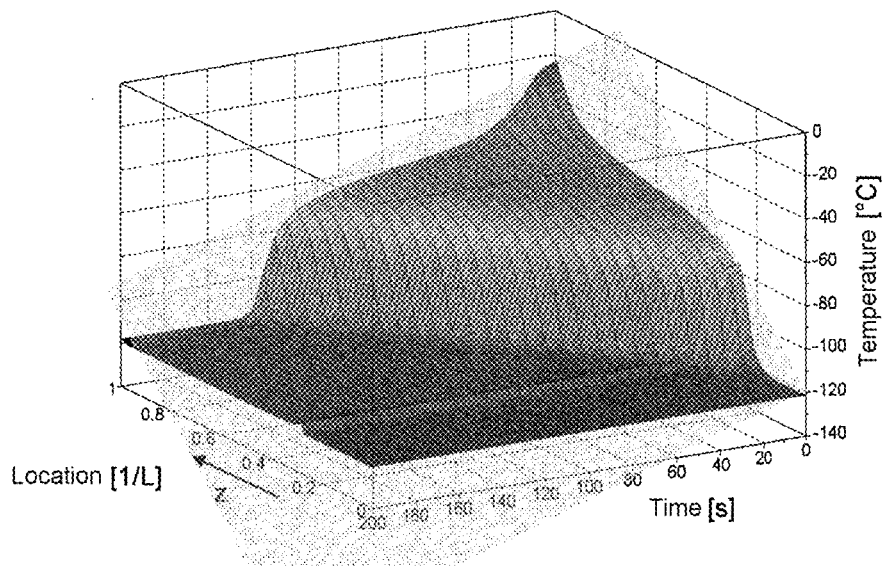

FIGS. 6 and 7 show results from investigations conducted by the applicant for a so-called Aluminum-Brazed Plate Fin Heat Exchanger (PFHE) in its longitudinal direction. In the left part of FIG. 6, the z axis is shown vertically. A scenario in which the warm process fluid stream (feed top left 13, discharge bottom right 12) through the heat transferer fails was simulated. To compare the starting conditions (t=0 s), the results according to the prior art are plotted according to the simulation software Aspen MUSE. It can be seen that there is good agreement for the starting condition. In FIG. 7, the temporal and spatial variation of the temperatures of the metal is shown as a 3D representation.

Figure 8:
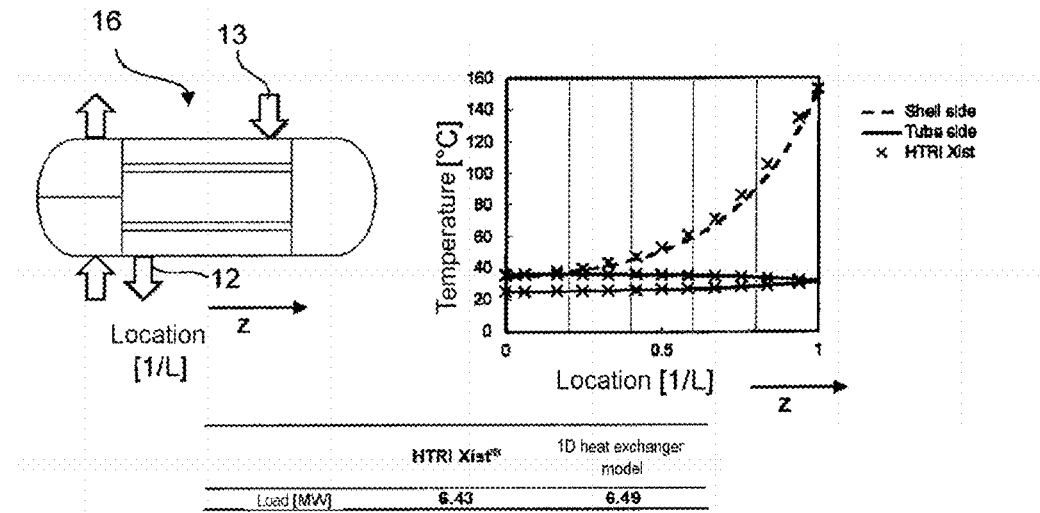
Figure 9:
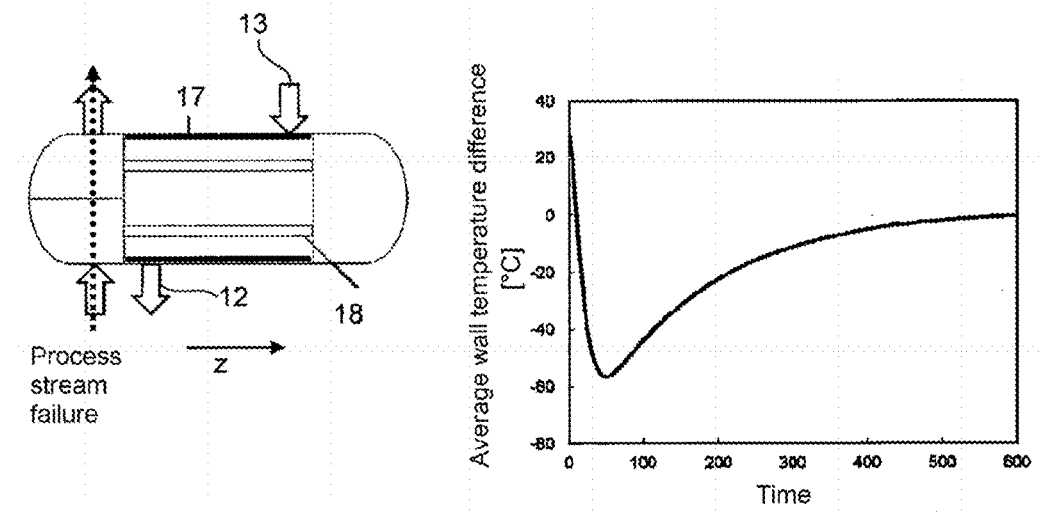

FIGS. 8 and 9 show results from investigations conducted by the applicant for a so-called Shell and Tube Heat Exchanger (STHE) 16. In such heat transferers, bundles of tubes 18 are enclosed by an outer shell wall 17. The z axis runs horizontally, and a scenario in which one of the two process streams fails was simulated (FIG. 8, FIG. 9). For comparison, in FIG. 8 the temperature variations for t=0 s according to the prior art are plotted according to the simulation software HTRI Xist®. In FIG. 9, the diagram on the right shows the temperature difference between the bundle of tubes and the shell of the heat transferer after the failure of the process fluid stream according to the one-dimensional modeling or simulation.

Figure 10:
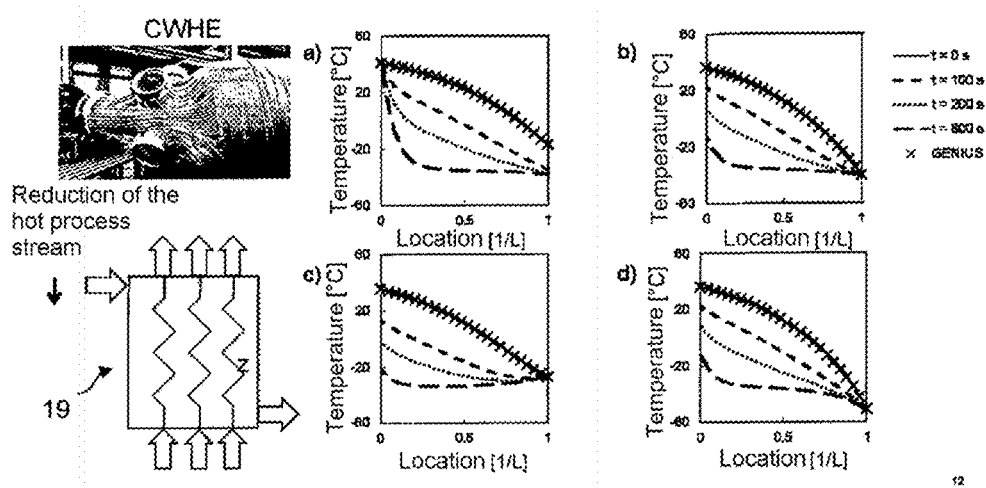

FIG. 10 shows results from investigations conducted by the applicant for a so-called Coil Wound Heat Exchanger (CWHE) 19. In such heat transferers, helically coiled bundles of tubes are enclosed by an outer shell. The top left part of FIG. 10 shows an image of a corresponding heat transferer. In FIG. 10, the temperature variations for t=0 s for the warm process stream (shell side, (a)) and three cold tube fractions (c)-(d) (solid lines) are plotted against the results of the simulation software GENIUS (x). There is agreement for the steady initial state. Also shown is the temperature variation of the three process streams in the helically coiled heat exchanger 19 for three points in time (t=100 s, 200 s, 800 s).

The curves for the variation in temperature over time and heat transfer coefficient profiles can thus serve as input data for a structural-mechanical stress analysis, and so a state of the strength of the respective heat transferer can be determined while taking into account thermohydraulic properties.

Figure 11:
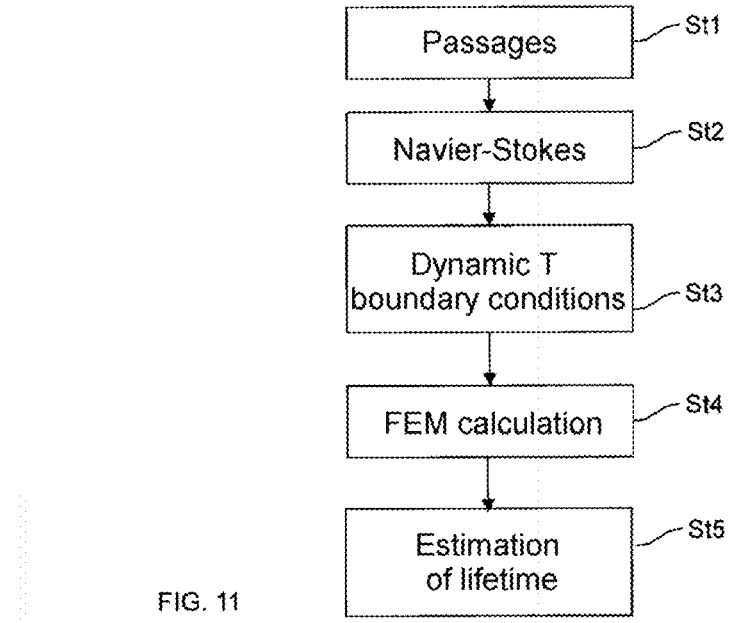
FIG. 11 shows a flow diagram for an exemplary embodiment of a simulation method for determining states of a heat transferer.
Figure 12:
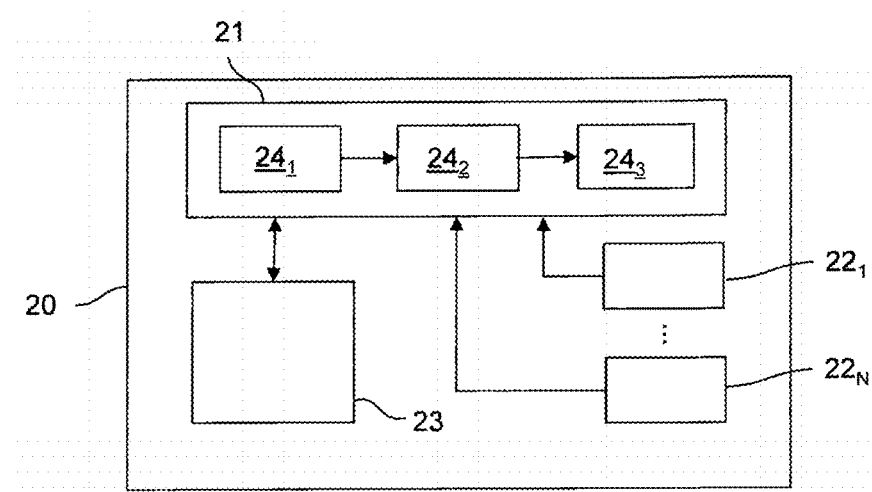
FIG. 12 shows a schematic representation for an exemplary embodiment of a process simulator for determining states of a heat transferer.
Figure 13:
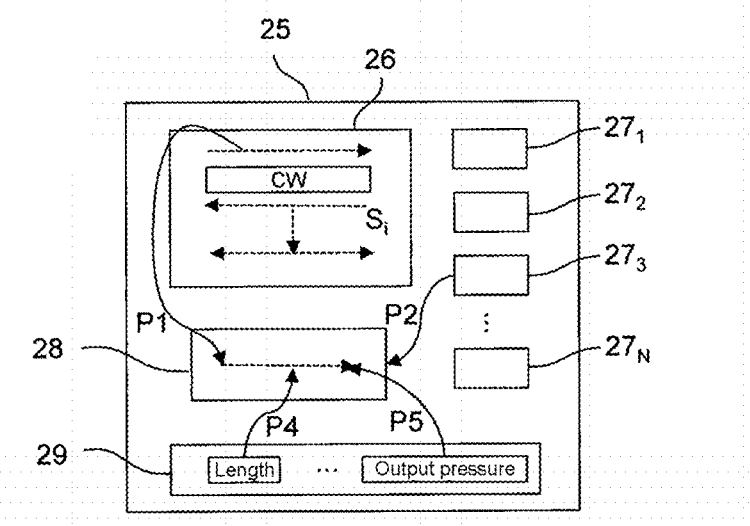
FIG. 13 shows a schematic representation for an exemplary embodiment of a user interface for a process simulator as shown in FIG. 12.

Some of the method steps for a corresponding method are summarized in FIG. 11. The method is carried out for example with the aid of a process simulator, which may be implemented as a computer program on a computer installation, such as for example a PC. FIG. 12 illustrates a possible exemplary embodiment of a process simulator. A user interface may be used for operating the process simulator. An example of a corresponding interface is one that is shown in FIG. 13. A variant of the method of simulation is explained below on the basis of FIGS. 11-13.

The process simulator 20 indicated in FIG. 12 has a calculation module 21, a number of model modules $22_1$-$22_N$, a memory module 23 and simulation modules $24_1$-$24_3$. The modules 21-24 are configured for example as software-implemented routines, program parts or functions. The process simulator 20 may be part of a software library. Also conceivable is a hardware implementation, in which the functions of the modules or units explained below are hard-wired, implemented as ASICs or else FPGAs.

For the process simulator 20 to be operated by an operator, a user interface 25 indicated in FIG. 13 is communicatively coupled to the process simulator 25. The user interface 25 and the process simulator 20 form a simulation device, to determine states of heat transferers with the aid of a thermohydraulic simulation.

The user interface 25 comprises a display device 26, which is designed to present visually a network of passages $S_i$ of a heat exchanger, first selection means for selecting a passage presented, second selection means for allocating a one-dimensional model to a selected passage, and third selection means for allocating simulation parameters to the one-dimensional model allocated to the selected passage. The user interface 25 displays for example various variants of one-dimensional models $27_1$-$27_N$ for selection and also makes it possible to allocate a set of simulation parameters to a respective selected model for a passage, the process simulator 20 then carrying out corresponding simulations by the simulation module $24_1$.

First, in the first step St1, the passages 14 in the plant, such as for example in the heat exchanger of FIGS. 1-3, are identified. The respective passages are depicted as one-dimensional systems with a process fluid inlet, a heat transfer section and a process fluid outlet, as is indicated in FIG. 4. For this purpose, the user interface 25 has a display device 26, which comprises for example a display in the manner of a monitor or touchscreen. The display 26 displays a network of passages Si with in each case a starting point and an end point, possible nodes, at which a number of passages adjoin one another, the dividing walls with potential heat capacities CW and further possible elements of the industrial plant to be considered. In FIG. 12, passages $S_i$ are indicated in a simplified manner by dashed arrows, with end points or discharges corresponding to the respective points of the arrows.

The user can thus select a passage (cf. arrow P1 in FIG. 13) and assign a suitable one-dimensional model. The selection is performed for example by entering a command or by clicking a mouse as a means of selecting the passage presented.

The user interface 25 offers a number of possible models $27_1$-$27_N$ for selection. For example, the model indicated in equation (1) may be allocated for a heated pipe of the selected passage. This is indicated by the arrow P2.

Subsequently, the user may establish simulation parameters that apply to the respective passage selected. For this purpose, selection means 29, for example buttons that can be clicked on, are provided. For example, the length of the passage and the pressure of the process fluid prevailing at the discharge are established (arrows P4 and P5). Further possible simulation parameters are for example a process fluid velocity, heat flow linear density, a number of supporting points along the length for the spatial discretization, a fluid temperature at the inlet or feed or a heat capacity. Further simulation parameters are conceivable, the variables to be assigned depending on the one-dimensional model chosen.

The process simulator 20 has corresponding model modules $22_1$-$22_N$, the model module $22_i$ being designed to carry out a one-dimensional, spatially and temporally independently performed discrete numerical calculation according to the model "i", taking into account associated simulation parameters. The one-dimensional models $27_1$-$27_N$ that can be selected via the user interface 25 are to this extent implemented computationally by the model modules $22_1$-$22_N$.

The user interface 25 then passes on to the process simulator 20 the respective model selection together with the associated established simulation parameters for the passages. A description language or a script similar to a VHDL code may be used for example for this. The established simulation parameters are stored in the memory module 23 and can be called up by the calculation module 21.

In step St2 (FIG. 11), a simulation of the process fluid flow and of the temperature distribution is then performed on the basis of Navier-Stokes equations. In the process simulator 20, the simulation module $24_1$ accesses the model modules $22_1$-$22_N$ and the simulation parameters that are present in the memory module 23 and performs the respective numerical calculations. Dynamic temperature distributions at the surfaces of the heat exchanger elements, such as plates, tubes, attachments, parting sheets, etc., are obtained in step St3 as the result.

The simulation in step St2 preferably includes terms that describe: a temporal mass enrichment of the process fluid, a spatial mass transfer of the process fluid, a rate of reaction, a temporal momentum enrichment of the process fluid, a spatial momentum transfer of the process fluid, a spatial pressure gradient, a position-dependent friction, influences of gravitational force on the process fluid, a temporal enthalpy enrichment of the process fluid, a spatial enthalpy transfer of the process fluid, a work of expansion of the process fluid, friction dissipation and/or a heat input from outside. For this purpose, corresponding model modules $22_1$-$22_1$, are kept in the process simulator 20, for example as stimulation routines, which can be retrieved and used by the (first) simulation module $24_1$. One-dimensional conservation equations (in particular for mass, momentum and energy) and thermodynamic state equations (in particular for density, temperature, pressure and energy) are respectively used thereby.

For compressible fluids, the Navier-Stokes equations can be summarized as follows:

$$\frac{\partial}{\partial t} c_j + \frac{\partial}{\partial z}(c_j u) = \dot{r}_j \text{ with } j = 1, \ldots nc \tag{3}$$

$$\frac{\partial}{\partial t}(\rho u) + \frac{\partial}{\partial z}(\rho u^2) = -\frac{\partial}{\partial z} p + \frac{\partial}{\partial z}\sigma + \rho g \sin(\Theta) \tag{4}$$

$$\frac{\partial}{\partial t}(\rho e) + \frac{\partial}{\partial z}(\rho e u) = -p\frac{\partial}{\partial z} u + \sigma\frac{\partial}{\partial z} u + \frac{U}{A_c}\dot{\bar{q}} \tag{5}$$

where $c_j = n_j/V$ is the molar density in mol/m³ for the fluid constituent j, nc is the number of fluid components (dimensionless), $\rho$ is the density in kg/m³, u is the velocity in m/s, e is the specific internal energy in J/kg, pe is the energy density in J/m³, $\Theta$ is the angle of attack in rad, $\rho \cdot g \cdot \sin(\Theta)$ is the hydrostatic stress in Pa/m, $\sigma$ is the friction tensor in N/m², p is the pressure in Pa, $\bar{q}$ is the heat flow density in W/m², A is the cross-sectional area in m² and U is the circumference. The density, velocity, etc. in this case are referred to the process fluid as a whole. To this extent, the density $\rho$ is for example the mixed density of the entire flowing fluid with its constituents.

The variables may in principle also be specified for each fluid constituent j and used as a basis for the simulation. For example, a demixing of the components or constituents of the respective process fluid may also be recorded in this way.

In this case, the first term in the mass conservation equation (3) stands for a mass enrichment, the second term for a mass transfer and the right side corresponds to the rate of reaction. In the momentum conservation equation (4), the first term on the left side stands for a momentum enrichment, the second term a momentum transfer. On the right side of the equation (4), the first term takes account of an acceleration due to a pressure gradient, the second term friction and the third term gravitational influences. The variables specified in the model equations can be used in particular as simulation parameters.

Depending on the desired accuracy of the simulation, however, some of the terms may also be ignored in consideration of the computational effort. It is in particular also assumed that the process fluid is homogeneous, and the vapor (yap) and the liquid (liq) flow with the same velocity:

$$\rho = \rho_{vap}\varepsilon + \rho_{liq}(1-\varepsilon), \tag{6}$$

where $\varepsilon$ is the volumetric vapor fraction.

When solving the equations, for example, temporal discretization and spatial discretization are performed independently of one another. As a result, the computational effort arising can be reduced. In the time direction, a BDF method is preferably used for the numerical solution. Spatially, a finite volume method may be used.

When starting the simulation by the process simulator 20, heat capacity values and/or a heat transfer value for the one-dimensional extended body may initially not be taken into account and only slowly increased incrementally or continuously, in order to ensure a numerical convergence of the one-dimensional model system that is realized with the aid of the model modules $22_1$-$22_N$. That is to say that a model system that is not thermally coupled is taken as a starting point, and the heat transfer is taken up to the desired value according to the respective simulation parameter.

In comparison with conventional CFD methods (computational fluid dynamics), the effort is greatly reduced because of the simplification to one-dimensional phenomena. A simulation that delivers reliable values can be performed with little effort.

The boundary conditions provided by the simulation module $24_1$ in step St3 then serve for the further calculations and simulation of structural-mechanical properties of the means for transferring heat that are fitted in the heat exchanger. Therefore, temperature and/or heat transfer coefficient profiles of the means for transferring heat are obtained and can be used as a basis in subsequent FEM calculations (step St4).

The second simulation module $24_2$ of the process simulator 20 is designed to carry out a corresponding FEM method. For example, the second simulation module $24_2$ carries out a method according to EP 1 830 149 B1, to the full content of which reference is made hereby (incorporated by reference).

In the structural-mechanical determination of temperature-induced stresses or the strength of a heat transferer, the following method steps may be carried out, a plate heat exchanger 10 with parting sheets 1 and profiles 2 (cf. FIG. 1) being considered for the sake of simplification:

calculating thermal stresses of the plate heat exchanger 10 in the interior of the heat exchanger during its operation by means of a three-dimensional numerical simulation; and determining the strength of the plate heat exchanger on the basis of the thermal stresses calculated.

In the three-dimensional numerical simulation of the thermal stresses, the spatial temperature distribution in the profiles 2 and in the parting sheets 1 is determined, in that a layer model of part of one of the profiles 2 in contact with one of the parting sheets 1 is created and used. The three-dimensional numerical simulation then comprises the steps of:

modeling the profiled part 2 as a metal block that homogeneously fills the space between the parting sheets 1 and on one of its sides is in thermally conductive contact with the parting sheet 1;

determining the overall heat input imparted by way of the process fluid into the profiled part 2 and the adjacent parting sheet 1 with a heat input from the fluid into the profiled part 2 with subsequent heat conduction through the profiled part 2 and from the profiled part 2 into the adjacent parting sheet 1; and introducing a quantity of heat corresponding to the first heat input into a first surface within the metal block. The method has in particular correction factors for the adaptation of the layer model.

For example, the FEM calculations give stress curves, data concerning comparative stresses or similar state-determining variables that may serve for an estimation for lifetime determining elements in the heat exchanger.

In the optional step St5, a lifetime, for example of a sheet in the heat exchanger, is therefore determined. The third simulation module $24_3$ is designed to calculate a lifetime consumption of the plant or of the heat exchanger in dependence on the structural-mechanical determination of temperature-induced stresses. A corresponding simulation system, such as the process simulator 20, is consequently based on the linking of the thermo-fluiddynamic simulation with a finite element analysis and lifetime estimation.

A finite element analysis for lifetime estimation, as performed in steps St4 and St5 or by the simulation modules 24$_2$ and 24$_3$, is explained for example in R. Hölzl: "Lifetime estimation of aluminum plate fin heat exchangers", Proceedings of the ASME 2012 Pressure Vessels & Piping Division Conference (PVP2012), Jul. 15-19, 2012, Toronto, Ontario, Canada [PVP2012-78343], to the full content of which reference is made here (incorporated by reference).

Figure 14:
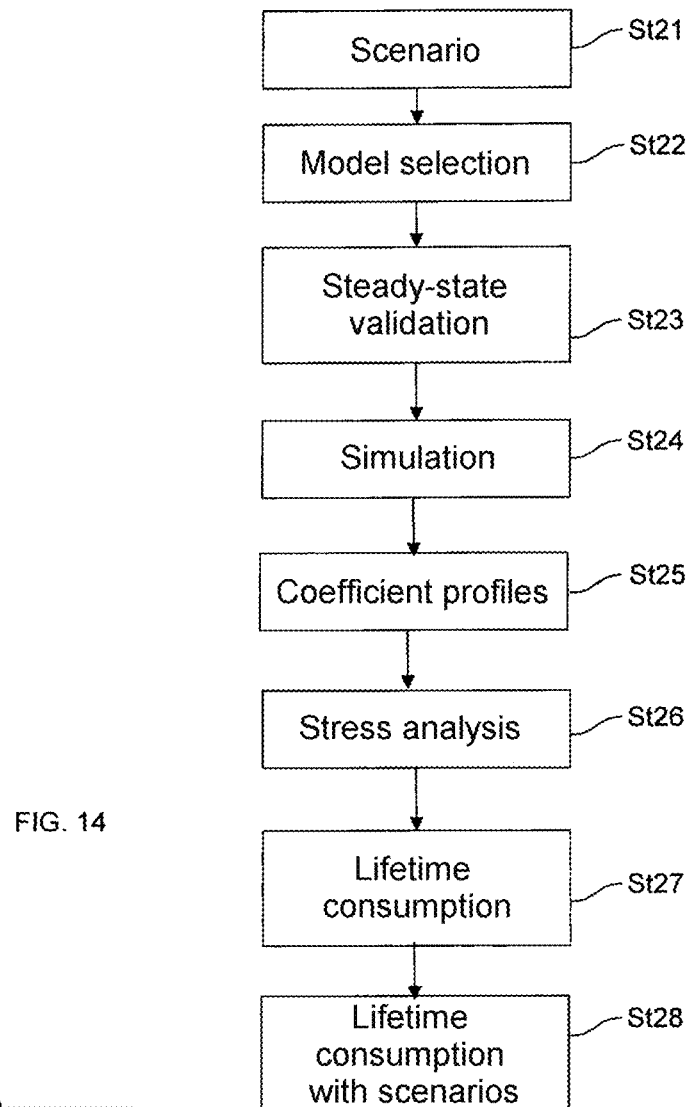
FIG. 14 shows a flow diagram for a further exemplary embodiment of a method of simulation for determining states of a heat transferer.

In FIG. 14, a flow diagram for a further exemplary embodiment of an expanded simulation method for determining states of a heat transferer is shown.

In step St21, critical operating scenarios are identified and defined with regard to thermal stresses, and consequently to the lifetime to be expected of the heat transferer. For example, start-up or shut-down scenarios can be determined.

In steps St22 to St24, the thermohydraulic modeling, validation and simulation of the corresponding heat transferer(s) is performed on the basis of the scenario definition. The effects taken into account in the simulation correspond to those explained above in relation to steps St2 and St3.

In step St25, dynamic temperature and heat transfer coefficient profiles are created as the result of the simulations. These represent the input data for the subsequent structural-mechanical calculations that are carried out in step St26. The structural-mechanical calculations provide for example fatigue curves for the calculated operating scenarios, from which the lifetime consumptions to be expected for the individual scenarios are determined (step St27). Thereafter, the resultant overall lifetime consumption for the heat exchanger being considered can be determined for the entirety of the defined operating scenarios (step St28).

The simulation results of the aforementioned analyses can be used to achieve a sufficiently long lifetime of heat transferers by adaptations. The findings can lead to a modified design of a heat transferer, to modified or optimized control concepts of the plant, to particular operating instructions for the operator, to the implementation of alarms or additional or modified process-engineering switching arrangements.

Figure 15:
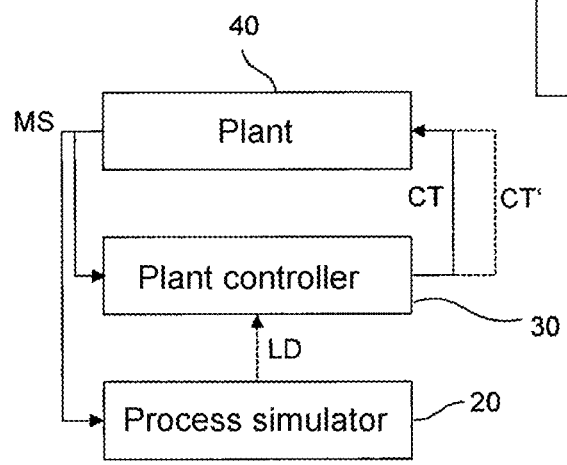
FIG. 15 shows a flow diagram for an exemplary embodiment of a method for operating an industrial plant.

FIG. 15 shows schematically an application of a process simulator 20 for supporting a plant controller 30 in a method for operating an industrial plant 40. Conventionally, the plant controller 30 controls the plant, such as for example a cryogenic plant for air separation, gas liquefaction or the like, with the aid of control signals CT. The plant controller 30 receives measuring or sensor signals MS from measuring sensors in the plant. For example, temperatures, pressures and flows are recorded and evaluated by the plant controller 30, in order that intended operating sequences can be set.

Also provided in FIG. 15 is a process simulator 20, which carries out a simulation of the executed operating sequences or modifications of the planned operating sequences. As explained in relation to FIG. 11, a lifetime consumption estimation is performed (cf. step St5), and so an operating sequence or an operating parameter can be modified by the plant controller 30 in such a way that an improved or extended operating time can be made possible, for example with an extended maintenance interval. For this purpose, the process simulator 20 supplies lifetime estimations LD to the plant controller 30 or operator. Within a maintenance cycle, further operation can take place with the improved operating parameters or the improved operating sequence. If appropriate, the plant controller 30 then outputs modified control signals CT'. Consequently, the operation of the plant 40 is optimized in dependence on the simulation by the process simulator 20.

The process simulator 20 may for example provide in the maintenance intervals suggestions for the operator for operating recommendations to be changed. It is also conceivable however that the plant controller 30 independently performs adaptations to the respective operating sequence or to the operating parameters on the basis of the simulation results LD.

To this extent, production, planning, design, conversion or operation of an industrial plant can be performed in a dependence on the thermohydraulic simulation, as described above. Structural parameters, such as a choice of material, plate thicknesses, tube lengths or the like, may also be determined before the production of the plant or the heat exchanger.

Although the present invention has been described using exemplary embodiments, it is modifiable in diverse ways. For example, heat transferers that have geometries other than that shown may be considered.

REFERENCE SIGNS USED 1 parting sheet
2 heat exchanging profile
3 distributing profile
4 bar
5 covering
6, 6a attachment
7 nozzle
8 central cuboid/stack
9 distributing profile access
10 plate heat exchanger
11 dividing wall
12 outlet/discharge
13 inlet/feed
14 passage
15 branch/discharge
16 PFHE heat transferer
17 shell
18 tubes
19 STHE heat transferer
20 process simulator
21 calculation module
22$_1$-22$_N$ model module
23 memory module
24$_1$-24$_3$ simulation module
25 user interface
30 plant controller
40 industrial plant
CT control signals
CW heat capacity
MS measuring data
LD simulation result
S1-S3 passage
St1-St28 method step

The invention claimed is:
1. A method for adjusting operation of a heat exchanger device, the method comprising:
performing a thermohydraulic simulation of at least one process stream through at least one passage in a heat exchanger device having a means for transferring heat, wherein, in the thermohydraulic simulation, temperature profiles that change over time are determined for the means for transferring heat, wherein, in the thermohydraulic simulation, a respective passage with a coupled means for transferring heat is replicated as a one-dimensional model system with a process stream feed, a heat transfer section, a process stream discharge, and a body with a heat capacity lying along the heat transfer section, wherein the respective passage is described with the aid of one-dimensional Navier-Stokes equations, wherein, in the thermohydraulic simulation,
a plurality of passages of a heat exchanger with in each case a starting point corresponding to a process stream feed and an end point corresponding to a process stream discharge are recorded,
nodes between the passages recorded, a number of starting and/or end points converging at a node, are recorded,
the one-dimensional model is assigned to each passage recorded,
pressures of the process fluid at process stream discharges and the nodes are established, and
a spatially and temporally discretized computer-implemented calculation of the one-dimensional model for determining the temperature profiles is performed; and determining the state of the heat exchanger device with a finite element method for a structural-mechanical calculation of the state based on the determined temperature profiles; and adjusting, via a plant controller, based at least in part on the determined state of the heat exchanger device, one or more operating parameters of the heat exchanger device to extend an operating time of the heat exchanger device, wherein the operating parameter is a pressure, a maintenance interval, or a time for replacement of the means for transferring heat.

2. The method according to claim 1, wherein the at least one process stream is a material stream, a fluid stream of a respective process, or an energy stream.

3. The method according to claim 1, further comprising determining, in the thermohydraulic simulation, heat transfer coefficient profiles that change over time at the means for transferring heat.

4. The method according to claim 1, wherein temperature profiles that change over time are determined using a model for a phase transition of the process fluid, for a material separation of constituents of the process fluid, for a filling operation with the process fluid, or for fluid-dynamic instabilities of the process fluid.

5. The method according to claim 1, wherein the one-dimensional simulation includes one or more terms describing one or more parameters selected from the following: a temporal mass enrichment of the process fluid, a spatial mass transfer of the process fluid, a rate of reaction, a temporal momentum enrichment of the process fluid, a spatial momentum transfer of the process fluid, a spatial pressure gradient, a spatial friction, influences of gravitational force on the process fluid, a temporal energy enrichment of the process fluid, a spatial enthalpy transfer of the process fluid, a work of expansion of the process fluid, friction dissipation, or a heat input from outside.

6. The method according to claim 1, wherein the state of the heat exchanger device is determined as a lifetime consumption in the manner of a Wöhler curve, with stress being determined in dependence on a number of operating cycles of the heat exchanger device.

7. The method according to claim 1, wherein the means for transferring heat comprises a tube, a plate, a parting sheet, a profiled part, a fin, a rib or a device for storing heat.

8. The method according to claim 1, wherein the simulation takes into account a Joule-Thompson effect of the process stream in one or more of the plurality of passages.

9. The method according to claim 1, further comprising determining spatially and temporally distributed states of stress of the heat transfer device.

10. The method according to claim 1, wherein, in the thermohydraulic simulation, a heat capacity value and/or a heat transfer value for the one-dimensional extended body is/are increased incrementally.

11. The method according to claim 1, wherein, in the thermohydraulic simulation, a heat capacity value and/or a heat transfer value for the one-dimensional extended body is/are increased continuously.

12. The method according to claim 1, wherein the method is implemented by a process simulator having a user interface comprising a display device, and said display device presents:
a network of passages visually,
a first selection means for selecting a passage presented,
a second selection means for allocating the one-dimensional model to a selected passage, and
a third selection means for allocating simulation parameters to the one-dimensional model allocated to the selected passage, the user interface being communicatively coupled to the process simulator.

13. The method according to claim 12, wherein the display device further displays one or more variants of the one-dimensional models for selection, the variants being selected from the following:
allowing account to be taken of a temporal mass enrichment of the process fluid, a spatial mass transfer of the process fluid, a rate of reaction, a temporal momentum enrichment of the process fluid, a spatial momentum transfer of the process fluid, a spatial pressure gradient, a spatial friction, influences of gravitational force on the process fluid, a temporal energy enrichment of the process fluid, a spatial enthalpy transfer of the process fluid, a work of expansion of the process fluid, friction dissipation, a heat input, or acoustic input from outside for the respective passage.

* * * * *